United States Patent
Konda

(10) Patent No.: US 7,507,590 B2
(45) Date of Patent: Mar. 24, 2009

(54) METHOD OF MANUFACTURING ARRAY SUBSTRATE AND METHOD OF MANUFACTURING ORGANIC EL DISPLAY DEVICE

(75) Inventor: Nobuo Konda, Fukaya (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 365 days.

(21) Appl. No.: 11/346,321

(22) Filed: Feb. 3, 2006

(65) Prior Publication Data

US 2006/0178072 A1 Aug. 10, 2006

(30) Foreign Application Priority Data

Feb. 10, 2005 (JP) ............................. 2005-034810

(51) Int. Cl.
*H01L 21/20* (2006.01)
(52) U.S. Cl. ................................ 438/4; 438/99; 438/34
(58) Field of Classification Search ................... 438/34, 438/99, 4; 445/24, 2, 504; 428/690; 427/66
See application file for complete search history.

(56) References Cited

U.S. PATENT DOCUMENTS

| 7,234,984 B2 * | 6/2007 | Nishikawa et al. ............. 445/2 |
| 7,258,586 B2 * | 8/2007 | Tamura et al. ................. 445/24 |
| 2004/0202777 A1 * | 10/2004 | Nishikawa et al. ............ 427/66 |
| 2004/0246433 A1 * | 12/2004 | Chen .......................... 349/192 |
| 2004/0247938 A1 * | 12/2004 | Yamaguchi et al. .......... 428/690 |
| 2005/0110929 A1 * | 5/2005 | Nakajima et al. ........... 349/139 |

FOREIGN PATENT DOCUMENTS

| JP | 11-231341 | 8/1999 |
| JP | 2001-305575 | 10/2001 |
| JP | 2004-227852 | 8/2004 |

* cited by examiner

*Primary Examiner*—Savitri Mulpuri
(74) *Attorney, Agent, or Firm*—Oblon, Spivak, McClelland, Maier & Neustadt, P.C.

(57) ABSTRACT

The size of a foreign substance which is present between a cathode and an anode and which contributes to a short circuit therebetween is measured. On the basis of the measured size, the wavelength of a laser beam with which the foreign substance is irradiated is set, as is the number of times of irradiation. The foreign substance is irradiated with the laser beam to eliminate at least part of the foreign substance.

4 Claims, 5 Drawing Sheets

METHOD OF MANUFACTURING ARRAY SUBSTRATE AND METHOD OF MANUFACTURING ORGANIC EL DISPLAY DEVICE

CROSS-REFERENCE TO RELATED APPLICATIONS

This application is based upon and claims the benefit of priority from prior Japanese Patent Application No. 2005-034810, filed Feb. 10, 2005, the entire contents of which are incorporated herein by reference.

BACKGROUND OF THE INVENTION

1. Field of the Invention

The present invention relates to a method of manufacturing an array substrate and a method of manufacturing an organic electroluminescence (EL) display device having the array substrate.

2. Description of the Related Art

Recently, for example, an organic EL display device and a liquid crystal display device have been used as a display device. Since the organic EL display device does not require a backlight unit that is used for liquid crystal display devices, it can be thinned, lightened, decreased in power consumption, reduced in costs and achieved as a mercuryless one. Since, moreover, it is a self-luminous display device, it has the features of wide viewing angle and high-speed response. The organic EL display device therefore receives attention as a device for displaying moving images such as a television (TV) set as well as a device for displaying still images such as a notebook personal computer (PC), a monitor and a viewer.

The organic EL display device includes an array substrate. The array substrate has a glass substrate and a plurality of organic EL elements arranged in matrix on the glass substrate. Each of the organic EL elements forms one pixel and has an anode, a cathode opposed to the anode and an EL layer interposed between the anode and cathode. The EL layer contains an organic compound having a light-emitting function and can emit any one of red light, green light and blue light.

The interval between the anode and cathode is as narrow as about 1 µm. In the process of manufacturing the organic EL display device, a short circuit is likely to occur between the anode and cathode. This short circuit occurs when a foreign substance is interposed between the anode and cathode, when the EL layer comes off due to trouble with manufacture, or the like. A pixel to which the foreign substance is attached becomes unlit and cannot emit light. If a number of pixels are unlit, a display device greatly decreases in image quality and display quality and cannot be shipped as a product. It is thus necessary to repair the unlit pixels.

For example, Jpn. Pat. Appln. KOKAI Publication No. 2004-227852 discloses a method of repairing an unlit pixel. According to this method, a short-circuited portion between an anode and a cathode is irradiated with a laser beam to form a high-resistance region between them. The method lights an unlit pixel and accordingly the pixel functions as a normal one. The method allows a foreign substance to be removed from a pixel with a laser beam to thereby light the pixel.

Foreign substances vary in shape and size. In the prior art method, the rate of success in repair varies to cause both a case where an unlit pixel can be repaired and a case where it cannot be repaired. Since an unlit pixel is difficult to repair with efficiency, a display device cannot be manufactured with stability.

The present invention has been made in consideration of the above situation and its object is to provide a method of manufacturing an array substrate and a method of manufacturing an organic EL display device with stability to repair an unlit pixel with efficiency.

BRIEF SUMMARY OF THE INVENTION

In order to attain the above object, according to one aspect of the present invention, there is provided a method of manufacturing an array substrate including a substrate and a plurality of elements arranged on the substrate and having a first electrode, a second electrode opposed to the first electrode and a shielding layer interposed between the first and second electrodes, the method comprising measuring a size of a foreign substance which is present between the first and second electrodes and which contributes to a short circuit between the first and second electrodes, setting a wavelength of a laser beam with which the foreign substance is irradiated and the number of times of irradiation, based on the size of the foreign substance, and irradiating the foreign substance with the laser beam to eliminate at least part of the foreign substance.

According to another aspect of the present invention, there is provided a method of manufacturing an organic EL display device, the organic EL display device including an array substrate having a substrate and a plurality of elements arranged on the substrate and having a cathode, an anode opposed to the cathode and an organic active layer interposed between the cathode and the anode, and a sealed substrate which is opposed to one side of the array substrate on which the elements are formed and which makes atmosphere between the sealed substrate and the array substrate airtight, the method comprising measuring a size of a foreign substance which is present between the cathode and the anode and which contributes to a short circuit between the cathode and the anode, setting a wavelength of a laser beam with which the foreign substance is irradiated and the number of times of irradiation, based on the size of the foreign substance, and irradiating the foreign substance with the laser beam to eliminate at least part of the foreign substance.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A method of manufacturing an organic EL display device according to an embodiment of the present invention will be described with reference to the accompanying drawings. First, the configuration of the organic EL display device manufactured by the method will be described.

Figure 1:
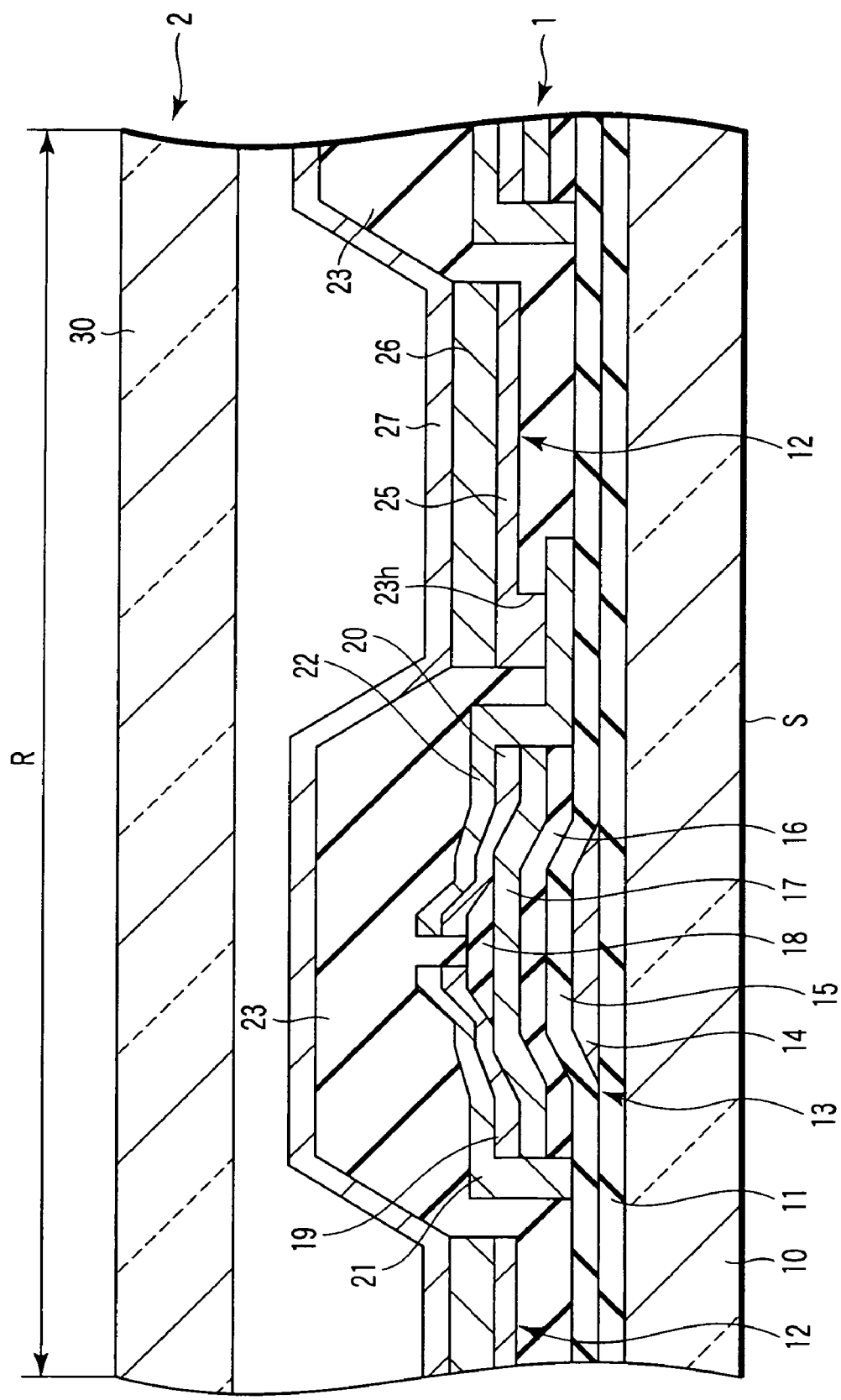
FIG. 1 is a sectional view of an organic EL display device manufactured by a method according to an embodiment of the present invention.

Referring to FIG. 1, the organic EL display device includes an array substrate 1 having a display surface S and a display region R and a sealed substrate 2 arranged opposite to the array substrate 1 with a given gap therebetween. A seal member (not shown) is provided along the outer edge of the sealed substrate 2. The array substrate 1 and the sealed substrate 2 are stuck to each other by the seal member. The sealed substrate 2 and the seal member make atmosphere between the sealed substrate 2 and seal member and the display region R of array substrate 1 airtight.

The space surrounded with the display region R of array substrate 1 and the sealed substrate 2 is filled with inert gases such as argon (Ar) gas and $N_2$. The space includes a desiccant (not shown) to dry the display device to such an extent that organic EL elements 12 (described later) are not adversely influenced.

The array substrate 1 has a transparent substrate 10 such as glass. An undercoat layer 11 is stacked on the substrate 10. For example, a $SiN_X$ layer and a $SiO_2$ layer are stacked in sequence as the undercoat layer 11. In the display region R, the organic EL elements 12 are arranged in matrix on the undercoat layer 11. Each of the elements 12 forms one pixel and can emit any one of red light, green light and blue light.

The organic EL elements 12 are connected to their respective TFTs 13 (thin-film transistors) serving as switching elements. Each of the TFTs 13 includes a gate electrode 14, a gate insulation film 15, an interlayer insulation film 16, a semiconductor film 17, an interlayer insulation film 18, a semiconductor film 19, a semiconductor film 20, a source electrode 21 and a drain electrode 22.

The gate electrode 14 is formed on the undercoat layer 11 using conductive materials such as MoW, Al and Ta. The gate insulation film 15 is formed on the undercoat layer 11 and gate electrode 14 using insulating materials such as $SiO_X$. The gate insulation film 15 is formed on and above the entire surface of the undercoat layer 11 of the display region R. The interlayer insulation film 16 is formed on the gate insulation film 15 using insulating materials such as $SiO_X$ and $SiN_X$ and stacked on the gate electrode 14. The semiconductor film 17 is formed on the interlayer insulation film 16 using a semiconductor of polysilicon or amorphous silicon.

The interlayer insulation film 18 is formed on the semiconductor film 17 using insulating materials such as $SiO_X$ and $SiN_X$ and stacked on the gate electrode 14. The semiconductor films 19 and 20 are separated from each other and formed on the semiconductor film 17 and the interlayer insulation film 18 using polysilicon or amorphous silicon. The semiconductor film 19 is connected to the source region of the semiconductor film 17, and the semiconductor film 20 is connected to the drain region of the semiconductor film 17. The source electrode 21 is formed on the semiconductor film 19 using conductive materials such as Al and Ta and connected thereto. The drain electrode 22 is formed on the semiconductor film 20 using conductive materials such as Al and Ta and connected thereto.

A partition layer 23 is formed on each of the TFTs 13 including the gate insulation film 15. The partition layer 23 is formed in such a grid pattern that its portion along the outer edge of an organic active layer 26 (described later) is protruded. The partition layer 23 is formed using insulative light-shielding materials such as $SiO_X$.

Each of the organic EL elements 12 has a cathode 25, an anode 27 opposed to the cathode and an organic active layer 26 interposed between the cathode and anode and serving as a light emitter. The cathode 25 is formed on and within the protruded portion of the layer 23, and electrically connected to the drain electrode 22 via a contact hole 23h formed in the partition layer 23. The cathode 25 is formed by conductive materials such as ITO (indium tin oxide) and Al. In the present embodiment, the outer surface of the array substrate 1 serves as the display surface S and thus the cathode 25 is formed by translucent ITO.

The organic active layer 26 is stacked on the cathode 25 and includes a hole carrying layer, a hole injection layer, a light-emitting layer, an electron injection layer and an electron carrying layer, none of which are shown. The anode 27 is formed on the partition layer 23 and the organic active layer 26 integrally as one component. The anode 27 is formed by conductive materials such as Al, MoW and ITO. The sealed substrate 2 has a cover 30 that is made of, e.g., glass.

A manufacturing apparatus 40 of an organic EL display device having the above configuration will be described in detail. The apparatus 40 inspects whether the array substrate 1 includes an unlit pixel before or after the array substrate 1 is stuck to the sealed substrate 2, and repairs the unlit pixel.

Figure 2:
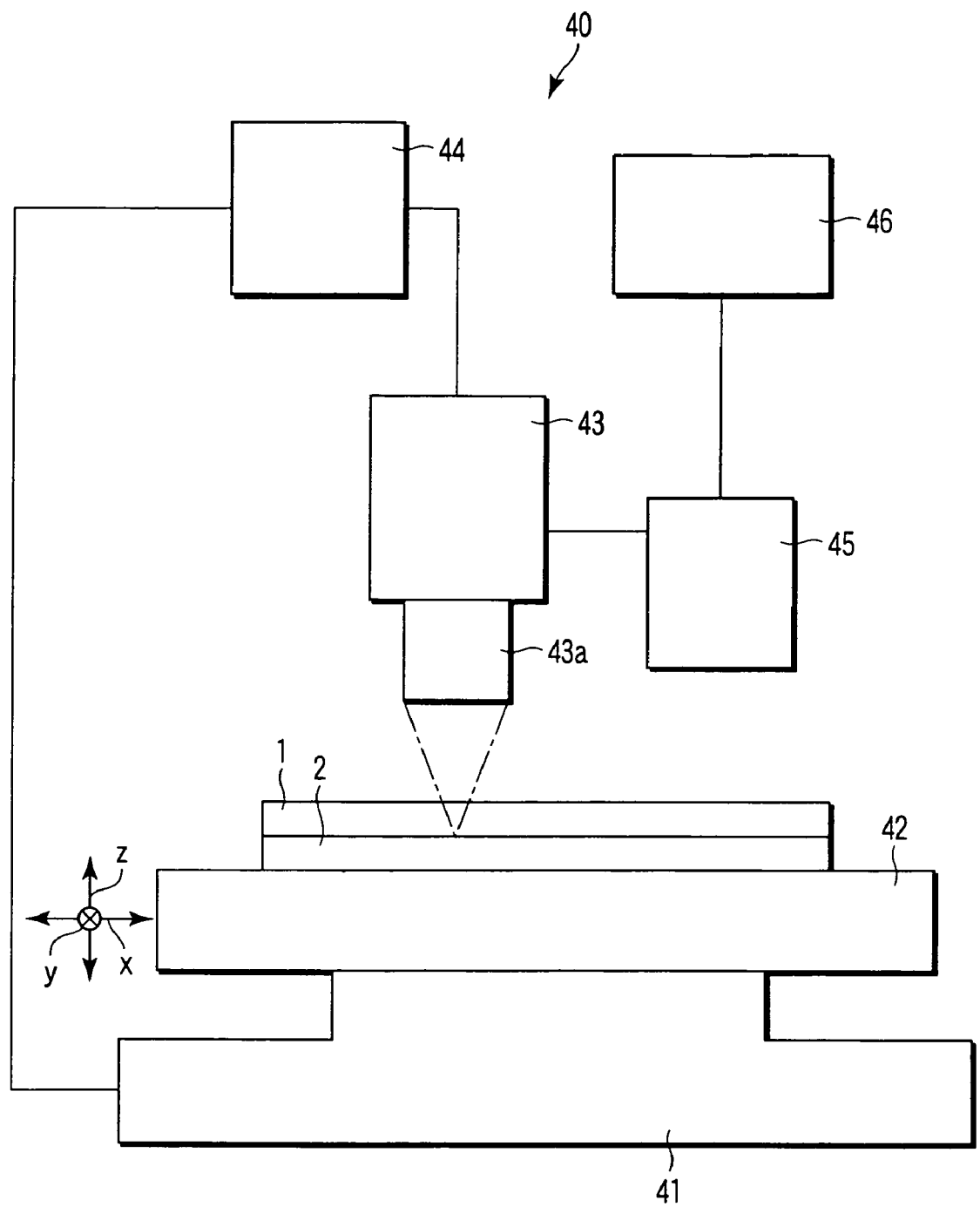
FIG. 2 is a schematic view of an apparatus for manufacturing the organic EL display device according to the embodiment of the present invention.

Referring to FIG. 2, the manufacturing device 40 includes a main body 41 having an antivibration function, a stage 42 that can be moved by the main body 41 in a first direction X, a second direction Y and a third direction Z which cross at right angles, a laser-beam emitting unit 43, a control unit 44 capable of controlling the main body 41 and the laser-beam emitting unit 43, a CCD 45 and a monitor 46. The laser-beam emitting unit 43 has an objective lens 43a serving as an optical system. The unit 43 can emit a laser beam such as a fundamental harmonic of, e.g., a YAG laser beam and a second harmonic whose wavelength is twice as long as that of the fundamental harmonic. The image information of a laser-beam irradiation portion, which is picked up and captured by the CCD 45 via the unit 43, is transmitted to the monitor 46. The image is therefore displayed on the monitor 46.

There follows a description of a method of inspecting whether an unlit pixel is present or absent in an organic EL display panel formed by sticking the array substrate 1 and the sealed substrate 2 using the manufacturing apparatus 40 and repairing the unlit pixel.

Figure 3:
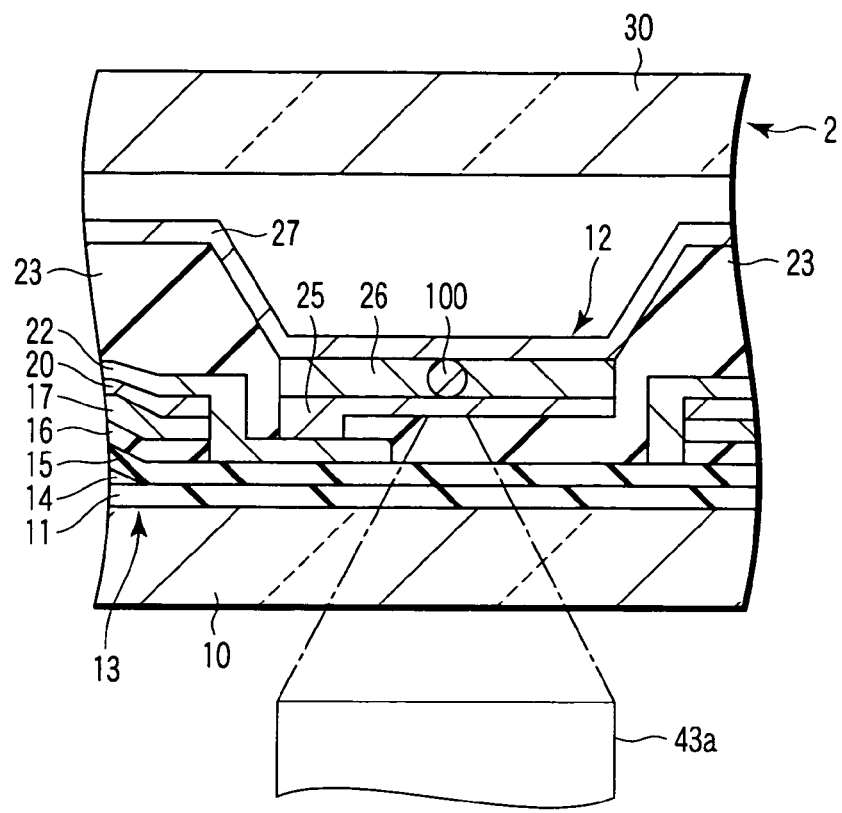
FIG. 3 is a sectional view of the organic EL display device shown in FIG. 1, an organic EL element of which includes a foreign substance.

First, an organic EL display panel is prepared as an object to be processed. Assume in the present embodiment that a foreign substance 100 is present between the cathode 25 and anode 27 of one or plural pixels of the organic display panel as illustrated in FIG. 3. The foreign substance 100 contributes to the short circuit between the cathode 25 and anode 27, and a pixel including the foreign substance cannot emit light.

As the foreign substance 100, there is metal and organic matter attached in which the manufacturing process the cathode 25, organic active layer 26 and anode 27 are formed. The film to which the foreign substance 100 is attached will be thinned or peeled off. In other words, the organic active layer 26 is formed thin or peeled off. It is thus evident from the above that the cathode 25 and anode 27 will be short-circuited irrespective of whether the foreign substance 100 is conductive or not.

Then, the organic EL display panel is conveyed and disposed on the stage 42. This panel is so disposed that the laser-beam emitting unit 43 faces the array substrate 1. The panel is driven to cause all the organic EL elements 12 to emit light. Thus, a pixel including the foreign substance 100 is unlit, and the unlit pixel is detected visually.

Then, the stage 42 is moved to make the unlit pixel and the objective lens 43a opposite to each other. An image of the unlit pixel picked up and captured by the CCD 45 through the objective lens 43a is displayed on the monitor 46. The size (area) of the foreign substance 100 is measured on the basis of the image displayed on the monitor 46. The foreign substance 100 is irradiated with a single laser beam having a given pulse width through the objective lens 43a using the laser-beam emitting unit 43. If the unlit pixel is not repaired, the foreign substance 100 is irradiated with a plurality of laser beams to repair the unlit pixel.

Figure 4:
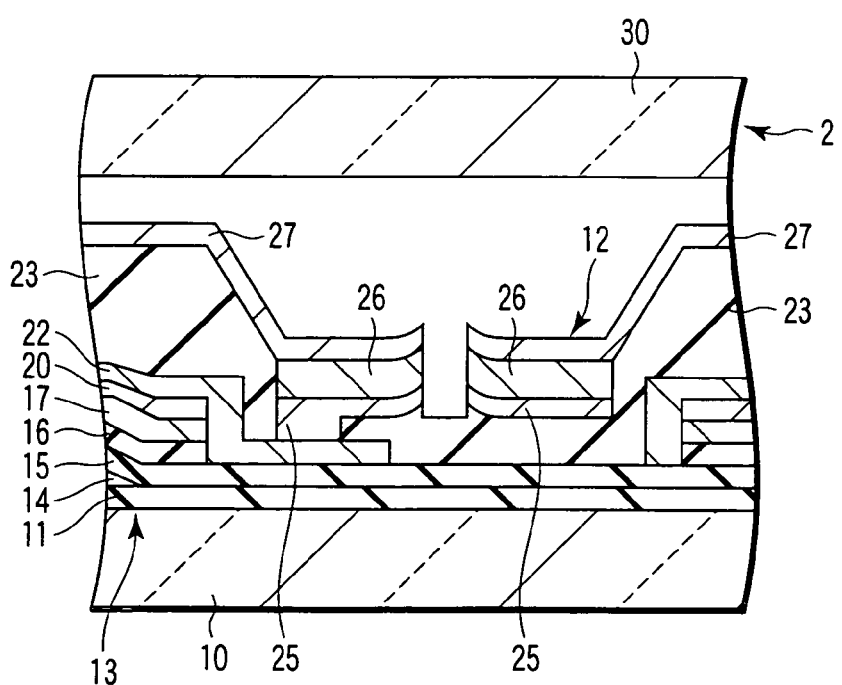
FIG. 4 is a sectional view of the organic EL display device from which the foreign substance shown in FIG. 3 has been removed.

The foreign substance 100 is therefore eliminated as shown in FIG. 4. In other words, the foreign substance 100 and the cathode 25, organic active layer 26 and anode 27, which are close to the foreign substance 100, are scattered. Since the organic EL element 12 of an image from which the foreign substance 100 is eliminated is protected by an inert gas and a desiccant, it can emit light for a long period of time. When a number of unlit pixels are detected, the size of the foreign substance 100 of each of the unlit pixels has only to be measured, and the pixels have only to be irradiated with laser beams.

The inventor of the present invention irradiated foreign substances 100 of different sizes with laser beams of different wavelengths and investigated the number of times of laser irradiation performed until unlit pixels were repaired.

Figure 5:
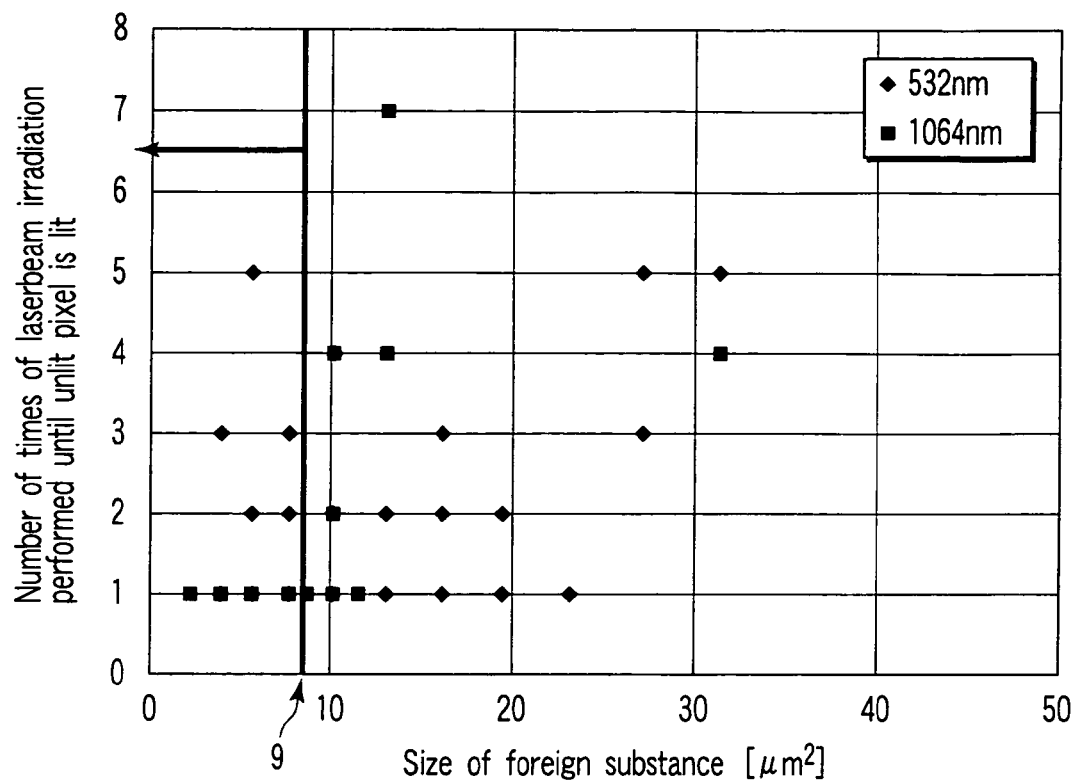
FIG. 5 is a graph showing a relationship between the size of the foreign substance shown in FIG. 3 and the number of times of irradiation of laser beams emitted until an unlit pixel is lit.

As shown in FIG. 5, the foreign substances 100 were irradiated with a fundamental harmonic of a YAG laser beam or a second harmonic. The wavelength of the fundamental harmonic is 1,064 nm and that of the second harmonic is 532 nm. When the size (area) of a foreign substance 100 is 9 $\mu m^2$ or smaller, it is found that an unlit pixel can be repaired by irradiating the foreign substance with the fundamental harmonic once. When the size of a foreign substance 100 exceeds 9 $\mu m^2$, it is found that an unlit pixel can be repaired by irradiating the foreign substance with the second harmonic one or more times.

A process of efficiently repairing an unlit pixel of an organic EL display panel in the manufacturing process will be described in detail.

Figure 6:
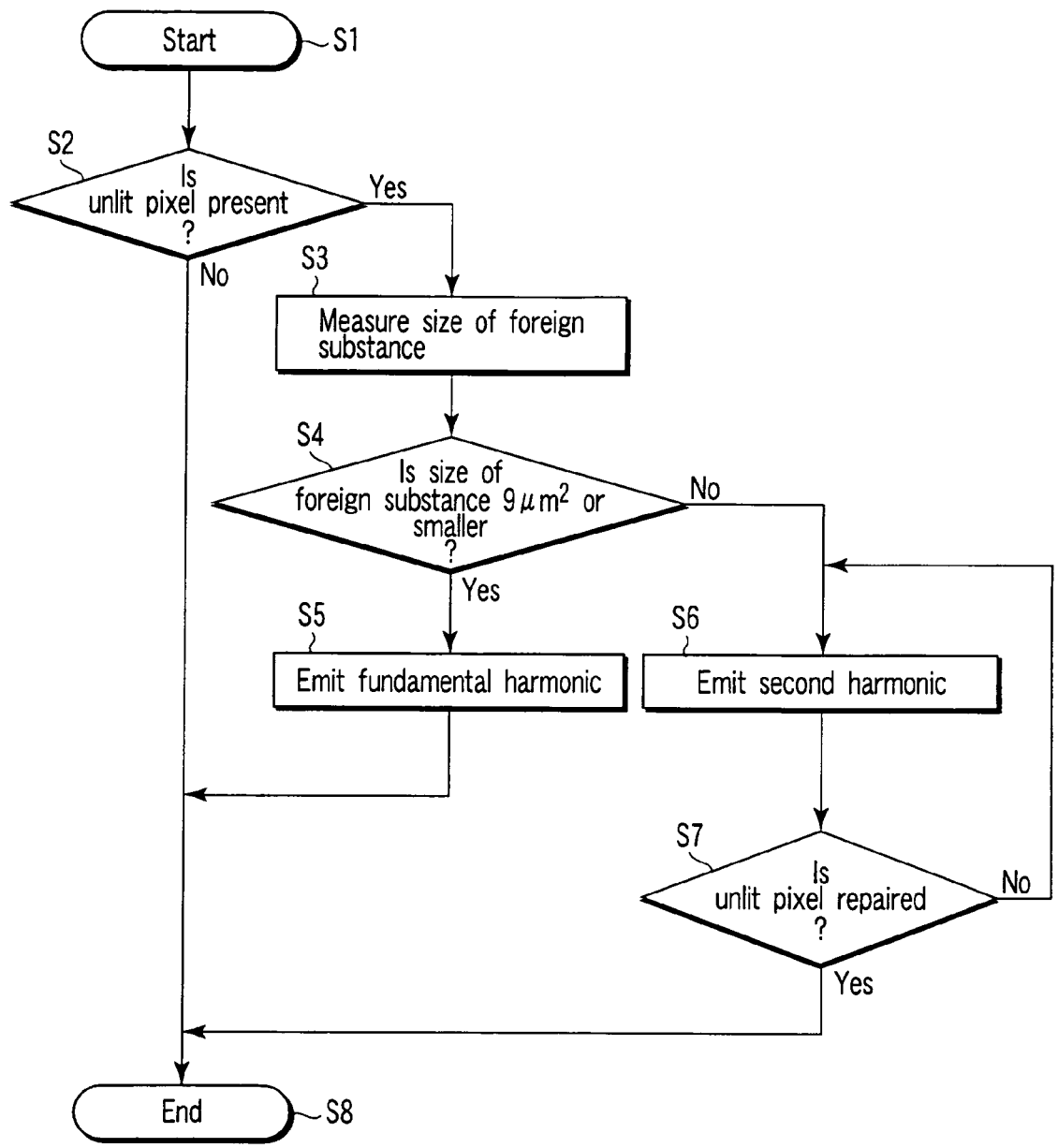
FIG. 6 is a flowchart of a repair process of the organic EL display device shown in FIG. 3.

As shown in FIG. 6, the repairing process starts in step S1. In step S2, an unlit pixel is detected. If no unlit pixel is detected, the repairing process ends (step S8). If the unlit pixel is detected, the size of a foreign substance 100 in the unlit pixel is measured in step S3. When the size of the foreign substance 100 is 9 $\mu m^2$ or smaller in step S4, the foreign substance 100 is irradiated with a fundamental harmonic once in step S5. Thus, the unlit pixel is repaired, and the repairing process ends (step S8).

After step S5, a step of determining whether the unlit pixel is repaired (the foreign substance 100 is eliminated) and, when it is not repaired, emitting laser beams until the unlit pixel is repaired, can be provided. Thus, no problems occur even though the unlit pixel cannot be repaired by one-time irradiation in step S5.

When the size of the foreign substance 100 exceeds 9 $\mu m^2$ in step S4, the foreign substance 100 is irradiated with a second harmonic once in step S6. In step S7, it is determined whether the unlit pixel is repaired (the foreign substance 100 is eliminated). If the unlit pixel is not repaired, it is irradiated (step S6) with the laser beams until it is repaired. If it is repaired (step S7), the repairing process ends (step S8).

Figure 7:
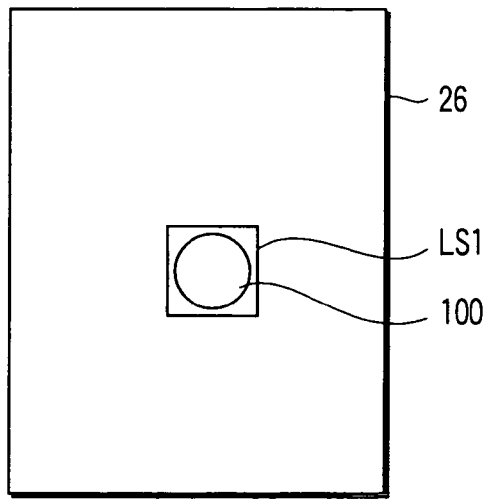
FIG. 7 is a schematic plan view of a foreign substance included in the organic EL element shown in FIG. 3 and a slit for laser beams.
Figure 8:
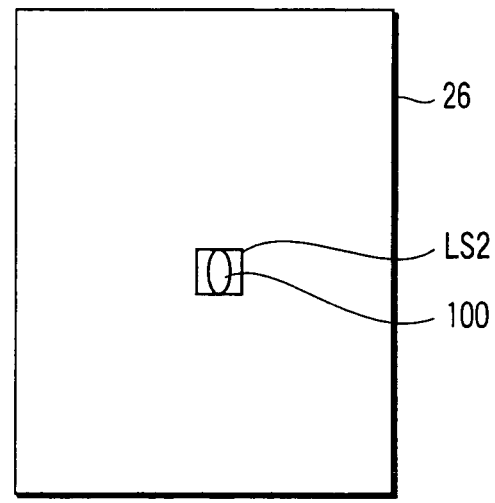
FIG. 8 is a schematic plan view of a foreign substance included in the organic EL element after it is irradiated with laser beams and a slit for the laser beams.

As shown in FIG. 7, in steps S5 and S6, a slit LS1 for a laser beam emitted to the foreign substance 100 is, for example, rectangular and has only to cover the foreign substance 100. The size of the foreign substance 100 to which a laser beam has been emitted may be the same as or smaller than that of the substance 100 to which no laser beam has been emitted, as illustrated in FIG. 8. In the case shown in FIG. 8, the foreign substance 100 can be irradiated with laser beams two or more times while the area of the slit LS2 is smaller than that of the slit LS1. In step S6, the foreign substance 100 can be irradiated with laser beams two or more times while the substance 100 is displayed on the monitor 46 and the slit LS2 covers at least the foreign substance 100.

According to the method of manufacturing the organic EL display device so configured, when a pixel is unlit, the size of a foreign substance 100 which is present between the cathode 25 and anode 27 of the unlit pixel and which contributes to the short circuit between the cathode and anode is measured. On the basis of the measured size, the wavelength of a laser beam with which the foreign substance 100 is irradiated is set, as is the number of times of irradiation. More specifically, it is determined whether the size of the foreign substance 100 is 9 $\mu m^2$ or smaller. If the size is 9 $\mu m^2$ or smaller, the foreign substance 100 is irradiated with a fundamental harmonic once. Thus, the foreign substance 100 is eliminated and the unlit pixel is completely repaired. Consequently, when the size of the foreign substance 100 is 9 $\mu m^2$ or smaller, the substance 100 has only to be irradiated with a fundamental harmonic once, thereby repairing the unlit pixel with efficiency.

Since an unlit pixel can be repaired with efficiency, an organic EL display device can be manufactured with stability.

The present invention is not limited to the foregoing embodiment, but various modifications can be made within the scope of the invention. For example, the wavelength of the fundamental harmonic is not limited to 1,064 nm. If the wavelength ranges from 1,032 nm to 1,096 nm, an unlit pixel can efficiently be repaired by irradiating a foreign substance 100 whose size is 9 $\mu m^2$ or smaller with a laser beam once.

If the size of a foreign substance 100 exceeds 9 $\mu m^2$, not only the second harmonic but also a laser beam whose wavelength is an integral multiple of that of the fundamental harmonic, such as a third harmonic whose wavelength is three times as long as that of the fundamental harmonic, can be emitted one or more times to repair an unlit pixel. Further, the fundamental harmonic can be emitted one or more times to repair an unlit pixel.

When the anode 27 is formed of translucent ITO, a laser beam can be emitted from above the organic EL element 12 or from the outer surface of the sealed substrate 2 to repair an unlit pixel. In this case, at least part of the foreign substance 100 can be eliminated. A target to be processed in repairing an unlit pixel is not limited to an organic EL display panel, but can be applied to an array substrate 1 to which nothing has been stuck.

The present invention can be applied to a method of manufacturing an array substrate including a substrate and a plurality of elements arranged on the substrate and having a first electrode, a second electrode opposed to the first electrode and a shielding layer interposed between the first and second electrodes. In this case, the size of a foreign substance which is present between the first and second electrodes and which contributes to a short circuit between the first and second electrodes is measured, the wavelength of a laser beam with which the foreign substance is irradiated on the basis of the measured size and the number of times of irradiation are set, and the foreign substance is irradiated with the laser beam. Thus, at least part of the foreign substance has only to be eliminated.

What is claimed is:

1. A method of manufacturing an organic EL display device, the organic EL display device including an array substrate having a substrate and a plurality of elements arranged on the substrate and having a cathode, an anode opposed to the cathode and an organic active layer interposed between the cathode and the anode, and a sealed substrate which is opposed to one side of the array substrate on which the elements are formed and which makes atmosphere between the sealed substrate and the array substrate airtight, the method comprising:

measuring a size of a foreign substance which is present between the cathode and the anode and which contributes to a short circuit between the cathode and the anode;

setting a wavelength of a laser beam with which the foreign substance is irradiated and the number of times of irradiation, based on the size of the foreign substance; and irradiating the foreign substance with the laser beam to eliminate at least part of the foreign substance, wherein the measuring is performed to determine whether the size of the foreign substance is 9 $\mu m^2$ or smaller, and the foreign substance is irradiated with the laser beam having a fundamental harmonic when the size of the foreign substance is 9 $\mu m^2$ or smaller.

2. The method according to claim 1, wherein the laser beam having the fundamental harmonic has a wavelength ranging from 1,032 nm to 1,096 nm.

3. The method according to claim 1, wherein the laser beam is emitted from another side of the array substrate which is opposed to the one side of the array substrate on which the elements are formed.

4. The method according to claim 2, wherein the laser beam is emitted from another side of the array substrate which is opposed to the one side of the array substrate on which the elements are formed.

* * * * *